(12) United States Patent
Fujimori et al.

(10) Patent No.: US 10,667,026 B2
(45) Date of Patent: May 26, 2020

(54) HANDLE COMPONENT, PORTABLE ELECTRONIC DEVICE, AND SPEAKER DEVICE

(71) Applicant: YAMAHA CORPORATION, Hamamatsu-shi (JP)

(72) Inventors: Hiroki Fujimori, Hamamatsu (JP); Kenta Ioku, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 16/451,256

(22) Filed: Jun. 25, 2019

(65) Prior Publication Data

US 2019/0313171 A1 Oct. 10, 2019

Related U.S. Application Data

(63) Continuation of application No. PCT/JP2017/045519, filed on Dec. 19, 2017.

(30) Foreign Application Priority Data

Dec. 28, 2016 (JP) .................................. 2016-257141

(51) Int. Cl.
*H04R 1/02* (2006.01)
*H05K 5/02* (2006.01)

(52) U.S. Cl.
CPC ................. *H04R 1/02* (2013.01); *H05K 5/02* (2013.01)

(58) Field of Classification Search
CPC . H04R 1/00; H04R 1/02; H04R 1/028; H05K 5/02; H05K 5/0204; H05K 5/0217; H05K 5/023
See application file for complete search history.

(56) References Cited

U.S. PATENT DOCUMENTS

| 4,815,559 A | * | 3/1989 | Shirley | H04R 1/02 |
| | | | | 181/144 |
| 2007/0000719 A1 | * | 1/2007 | Bothe | H04R 1/026 |
| | | | | 181/150 |

(Continued)

FOREIGN PATENT DOCUMENTS

| DE | 202008003376 U1 * | 7/2008 | ............. H04R 1/026 |
| JP | H10170132 A | 6/1998 | |
| JP | H11214855 A | 8/1999 | |

OTHER PUBLICATIONS

International Search Report issued in Intl. Appln. No. PCT/JP2017/045519 dated Mar. 20, 2018. English translation provided.

(Continued)

*Primary Examiner* — Thang V Tran
(74) *Attorney, Agent, or Firm* — Rossi, Kimms & McDowell LLP

(57) ABSTRACT

Provided is a handle component to be mounted to an opening portion formed in a side plate of a cabinet, including: a flange portion configured to be brought into contact with a peripheral edge portion of the opening portion on an inner surface of the side plate; a bottom wall portion including a recessed surface; a handle, which has a bar-like shape and via which both side portions of the bottom wall portion are connected in a bridging manner; and a protruding portion, which is formed on at least one of both end portions of the bottom wall portion arranged at both ends in a direction orthogonal to a longitudinal direction of the handle, and is configured to cover an end face of the opening portion of the side plate, wherein the protruding portion includes a surface projecting outward to be continuous with the recessed surface.

6 Claims, 8 Drawing Sheets

(56) References Cited

U.S. PATENT DOCUMENTS

2015/0139463 A1    5/2015  Samimrad
2017/0155986 A1*   6/2017  Mahler .................. H04R 1/025

OTHER PUBLICATIONS

Written Opinion issued in Intl. Appln. No. PCT/JP2017/045519 dated Mar. 20, 2018.
Yamaha "Speaker System. Concert Club V Series." Web. Jun. 5, 2019. Internet URL: http://www.yamahaproaudio.com/global/en/products/speakers/clubv_series/features.jsp. 24 pages.
Scumback Speakers. "Scumback Handles." Web. Jun. 5, 2019. Internet URL: http://www.scumbackspeakers.com/handles.html. 2 pages.
English translation of Written Opinion issued in Intl. Appln. No. PCT/JP2017/045519 dated Mar. 20, 2018, previousy cited in IDS filed Jun. 25, 2019.
International Preliminary Report on Patentability issued in Intl. Appln. No. PCT/JP2017/045519 dated Jul. 11, 2019. English translation provided.

\* cited by examiner

HANDLE COMPONENT, PORTABLE ELECTRONIC DEVICE, AND SPEAKER DEVICE

CROSS-REFERENCE TO RELATED APPLICATION

The present application is continuation of International Application No. PCT/JP2017/045519 filed on Dec. 19, 2017, which claims priority from Japanese Application No. JP2016-257141 filed on Dec. 28, 2016. The contents of these applications are hereby incorporated by reference into this application.

TECHNICAL FIELD

The present invention relates to a handle component to be mountable to various devices for carrying the devices, and relates to a portable electronic device and a speaker device each including the handle component.

BACKGROUND ART

Hitherto, for example, in a portable electronic device such as a speaker device, a handle is provided for convenience of carrying in some cases.

For example, according to a speaker cabinet described in Non Patent Literature 1, handles are provided on both sides of the speaker cabinet. Further, as a handle component mountable to the speaker cabinet of this type, there is known a handle component described in Non Patent Literature 2. In general, those handle components are made of metal. In the handle component, a space configured to allow insertion of a hand is formed on an inner side of a flange that is used for mounting to the speaker cabinet, and a bar-like handle to be grasped by hand is provided in the space.

The flange of the handle component is brought into contact with a peripheral edge portion of an opening portion formed in a side portion of the speaker cabinet from an outer side of the speaker cabinet, and is fixed to a side plate with screws. In this manner, the handle component is fixed to the speaker cabinet. When the speaker device has a relatively small weight, the speaker device is carried by one person. However, when the speaker device has a large weight, from both sides of the speaker device, two persons each insert a hand into the space of the handle component so as to lift up the speaker device while grasping the handle.

CITATION LIST

Non Patent Literature

[NPL 1] Yamaha Speaker Club V series, Internet URL: http://www.yamahaproaudio.com/global/en/products/speakers/cl ubv_series/features.jsp
[NPL 2] Scumback Handle, Internet URL: http://www.s-cumbackspeakers.com/handles.html

SUMMARY OF INVENTION

Technical Problem

However, in any of the handle components, the flange is mounted from the outer side of the speaker cabinet so as to cover the speaker cabinet. Thus, the flange is visible from outside, and a portion appearing on the surface of the speaker cabinet is large. Accordingly, the handle component becomes conspicuous on a side surface of the speaker cabinet. As a result, when the handle component is applied to a wooden speaker cabinet, a design making use of woody material is impaired, and luxuriousness is lost.

As countermeasures against such disadvantage, it is conceivable to mount the flange from the inner side of the side plate (inner side of a box-like body). In this case, an end face (cut end) of the side plate is exposed in the opening portion of the speaker cabinet. Thus, when the speaker device is to be carried, the back of a hand or a wrist comes into contact with a corner portion on an upper end side of the opening portion. When the speaker device is heavy, the back of the hand is pressed by the corner portion, which may cause a pain in the back of the hand.

The present invention has been made in view of the above-mentioned circumstances, and has an object to prevent impairment of a design after mounting of a handle component by mounting a flange portion from an inner side of a side plate of a cabinet, and to cause a pain less liable to be felt even when a hand comes into contact with the handle component at the time of carrying.

Solution to Problem

According to one aspect of the present invention, there is provided a handle component to be mounted to an opening portion formed in a side plate of a cabinet, including: a flange portion configured to be brought into contact with a peripheral edge portion of the opening portion on an inner surface of the side plate; a bottom wall portion including a recessed surface that is open outward so as to form a hand insertion space portion on an inner side of the flange portion; a handle, which has a bar-like shape, and via which both side portions of the bottom wall portion are connected in a bridging manner; and a protruding portion, which is formed on at least one of both end portions of the bottom wall portion arranged at both ends in a direction orthogonal to a longitudinal direction of the handle, and is configured to cover an end face of the opening portion of the side plate, wherein the protruding portion has a surface formed to include a projecting curved surface projecting outward to be connected with the recessed surface of the bottom wall portion.

With the configuration in which the flange portion of the handle component is mounted to the inner surface of the cabinet, the flange portion is not exposed to the outside, and can be used in an inconspicuous state. When the device having the handle component mounted thereto is to be carried, a hand is inserted into the hand insertion space portion from above to hold the handle. The protruding portion covers the end face of the opening portion of the cabinet on a side on which the back of the hand or the wrist is to be arranged. Thus the back of the hand or a wrist does not come into direct contact with a corner portion of the end face of the opening portion. The protruding portion covering the end face of the opening portion is formed to include the projecting curved surface. Thus, even when the back of the hand or the wrist hits against the protruding portion, suffering a pain or an injury is prevented.

In the handle component of the present invention, it is preferred that a distance from the handle to the protruding portion be larger than a distance from the handle to an end portion of the bottom wall portion on an opposite side of the protruding portion.

A space from the handle to the protruding portion is larger than a space on the opposite side. Therefore, under a state in which the back of the hand or the wrist is less liable to hit against the protruding portion, the handle can be grasped to carry the device.

Further, owing to different distances from the handle in the hand insertion space portion, while a position of the handle is checked, the handle component can be mounted to the cabinet so that the protruding portion takes a suitable posture.

In the handle component of the present invention, it is desired that a height from a surface of the flange portion to a surface of the handle be equal to or smaller than a height from the surface of the flange portion to a surface of a peak portion of the protruding portion.

When the height up to the surface of the peak portion of the protruding portion is set to be equal to or smaller than the thickness of the side plate of the cabinet, the surface of the peak portion of the protruding portion and the surface of the handle do not protrude outward from the surface of the side plate of the cabinet. With this configuration, when a surface of the device to which the handle component is mounted is placed as a ground surface, contact of the protruding portion and the handle with the ground surface is prevented, and the posture during grounding is stabilized.

In a portable electronic device of the present invention, the above-mentioned handle part is mounted in the opening portion of the side plate of the cabinet.

In this case, it is preferred that the height from the surface of the flange portion to the surface of the handle be equal to or smaller than a thickness of the side plate.

Advantageous Effects of Invention

According to the present invention, the flange portion can be mounted to the inner surface of the cabinet, and hence an external design of the cabinet is not impaired. Further, the protruding portion covers the end face of the opening portion of the cabinet, and hence the back of the hand or the wrist can be prevented from coming into direct contact with the end face of the opening portion during carrying.

DESCRIPTION OF EMBODIMENTS

Now, a handle component and a portable electronic device according to an embodiment of the present invention are described.

Figure 1:
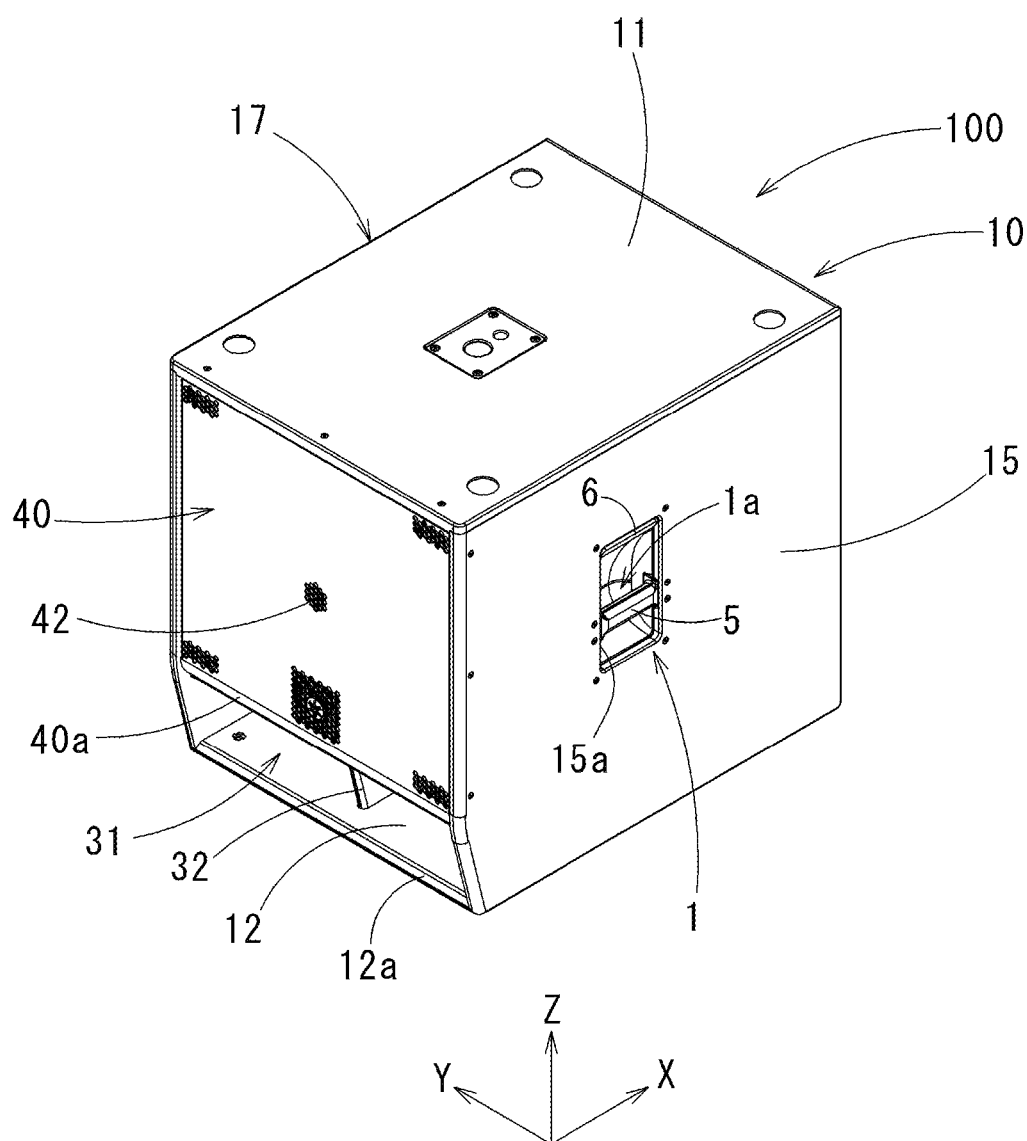
FIG. 1 is a perspective view of a speaker device to which handle components according to an embodiment of the present invention are mounted.

A portable electronic device 100 including handle components 1 according to this embodiment is a speaker device, and the handle components 1 are mounted to side surfaces of a speaker cabinet 10 of the speaker device. In the following description, based on directions viewed from a front of the speaker device 100 illustrated in FIG. 1, a front-and-rear direction, a right-and-left direction, and an up-and-down direction of the speaker device 100 are defined as an X direction, a Y direction, and a Z direction, respectively. A direction indicated by each arrow is defined as a plus side, and a direction opposite thereto is defined as a minus side.

<Overall Configuration of Speaker Device>

First, an overall configuration of the speaker device 100 is described. The speaker device 100 includes the speaker cabinet 10 and a speaker unit 20 mounted inside the speaker cabinet 10.

The speaker cabinet 10 includes a box-like body 17 having a substantially cuboid shape. The box-like body 17 includes a top plate 11 and a bottom plate 12 each having a rectangular shape, a baffle plate 13 being a front, a pair of side plates 15 arranged on both sides of the baffle plate 13, and a back plate 16 arranged between rear portions of the side plates 15 to be parallel to the baffle plate 13.

Figure 3:
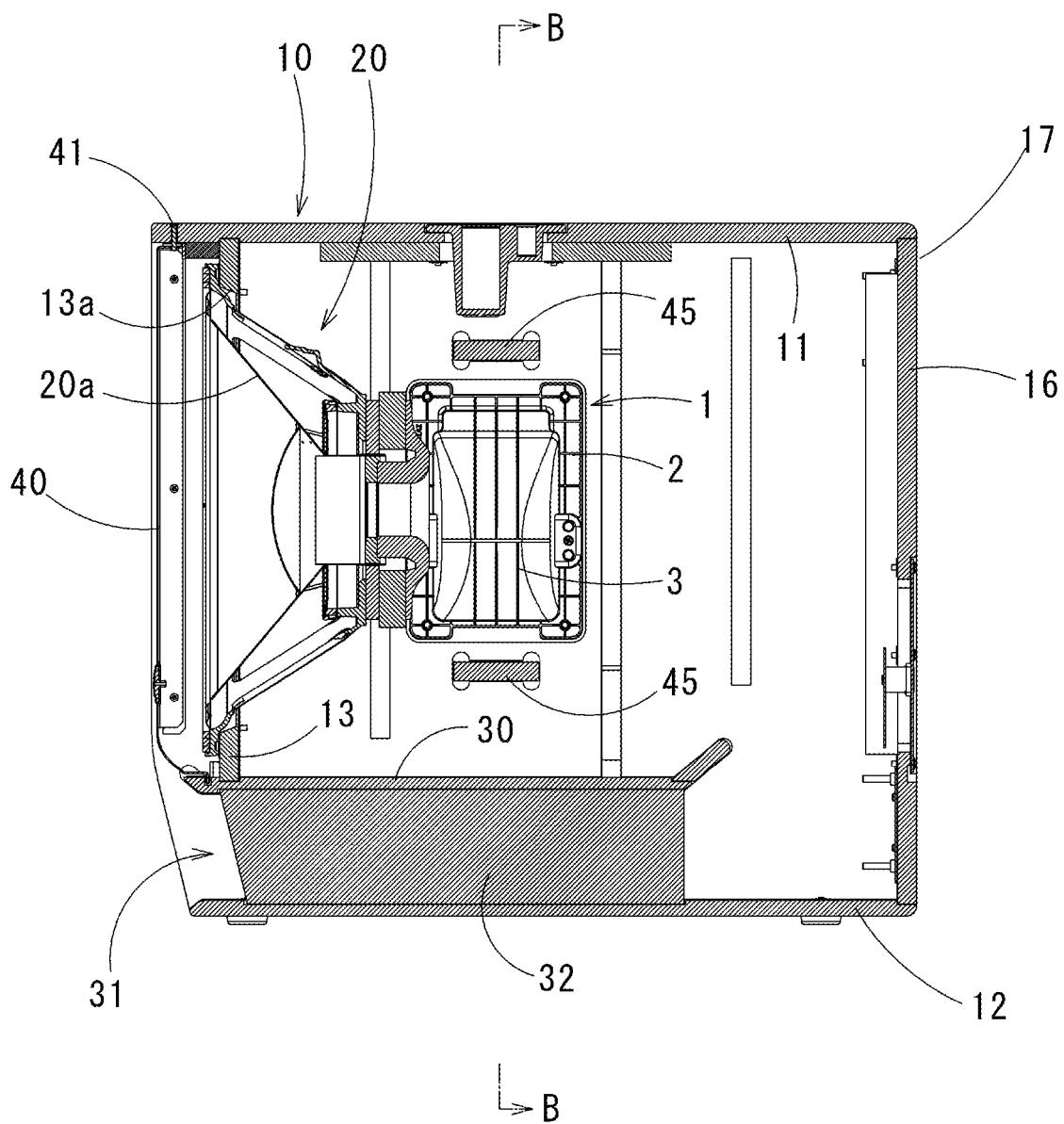
FIG. 3 is a vertical sectional view taken along the line A-A in FIG. 2.

In the example illustrated in FIG. 3, the speaker unit 20 is a speaker including a diaphragm 20a having a cone shape (conical shape). The speaker unit 20 is fixed to a peripheral edge portion of an opening 13a formed in the baffle plate 13. As a result, the speaker unit 20 is mounted to the speaker cabinet 10 so that the diaphragm 20a is directed forward (to the minus side in the X direction).

A partition plate 30 is provided between the speaker unit 20 and the bottom plate 12 of the speaker cabinet 10 at a distance from the back plate 16 so as to be parallel to the bottom plate 12 (along the front-and-rear direction). As illustrated in FIG. 3, a space on a rear side (plus side in the X direction) of the speaker unit 20 communicates with a space between the bottom plate 12 and the partition plate 30, and hence an opposing region between the bottom plate 12 and the partition plate 30 defines a bass reflex port 31.

Figure 2:
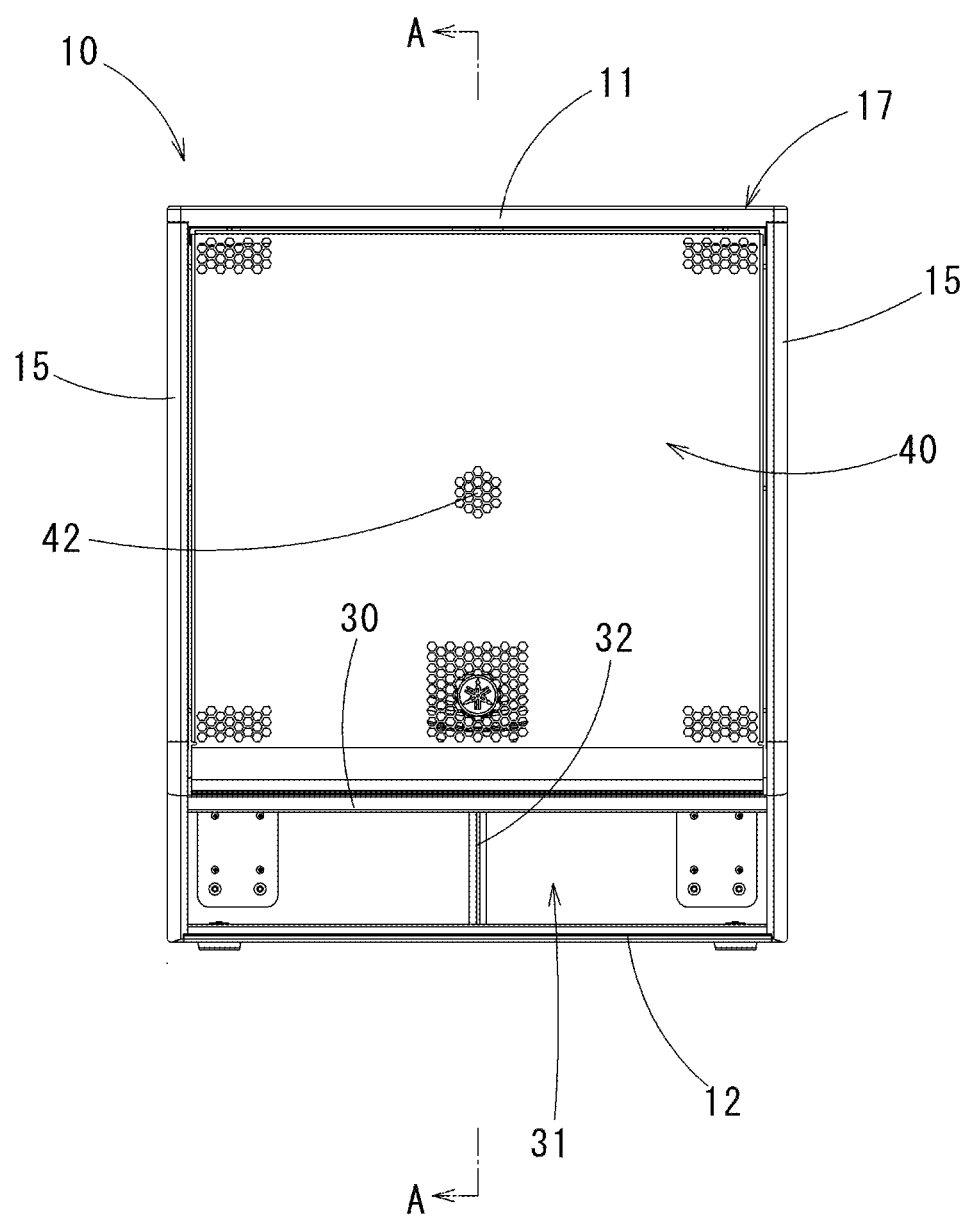
FIG. 2 is a front view of the speaker device of FIG. 1.

Meanwhile, on a front side (minus side in the X direction) of the speaker unit 20 and the baffle plate 13, a grille plate 40 having a rectangular shape in front view is mounted. The grille plate 40 is formed by, for example, bonding cloth on a surface of a metal plate such a steel, and has, as illustrated in FIG. 2, a plurality of holes 42 formed in a dotted manner in a plane direction. The plurality of holes 42 are configured to allow passage of a sound emitted from the diaphragm 20a.

The top plate 11, the bottom plate 12, the baffle plate 13, the side plates 15, and the back plate 16 forming outer plates of the box-like body 17, and the partition plate 30 defining the bass reflex port 31 are each made of wood. Those plates are each formed of, for example, a plywood board, a particle board, or a medium density fiberboard (MDF) so as to have an appropriate thickness.

<Configuration of Handle Component>

An opening portion 15a having a rectangular shape in front view is formed in each of the side plates 15 of the box-like body 17. The handle component 1 is mounted in the opening portion 15a.

As illustrated in FIG. 5 to FIG. 8, the handle component 1 includes a flange portion 2 for mounting to the side plate 15, a bottom wall portion 3, side wall portions 4, and a handle 5. Regarding the handle component 1, in a perspective view of FIG. 5, a longitudinal direction of the handle 5 of the handle component 1 corresponds to the X direction, a thickness (height) direction of the handle component 1 orthogonal to the handle 5 corresponds to the Y direction, and the up-and-down direction of the handle component 1 corresponds to the Z direction.

The flange portion 2 has a rectangular frame shape so as to be capable of coming into contact with a peripheral edge portion of the opening portion 15a on an inner surface of the side plate 15. The flange portion 2 is fixed at four corners to the side plate 15 through, for example, screw fixation.

On an inner side surrounded by the flange portion 2, the side wall portions 4 are formed continuously with long sides of the flange portion 2 so as to form both side portions of the flange portion 2. Further, the bottom wall portion 3 extending in the up-and-down direction (Z direction) is formed so as to connect short sides of the flange portion 2 between the side wall portions 4. The bottom wall portion 3 has a curved shape so as to connect the short sides of the flange portion 2 by a recessed surface 3a that is open outward (to the minus side in the Y direction). A region including the flange portion 2, the bottom wall portion 3, and the side wall portions 4 is formed integrally and made of a metal material such as stainless steel.

Figure 7:
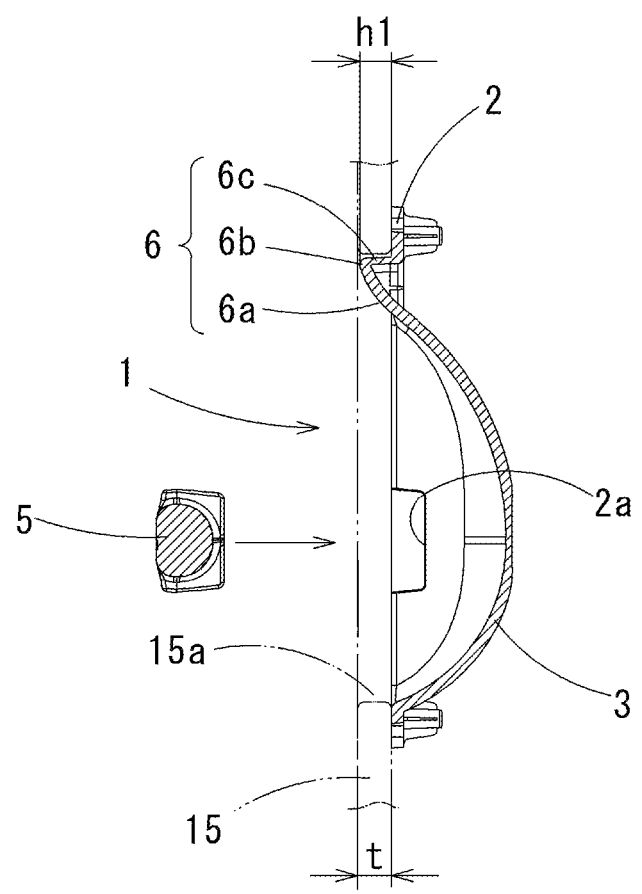
FIG. 7 is a vertical sectional view taken along the line C-C in FIG. 6, for illustrating a state in which the handle is removed from a recessed portion of a flange portion.
Figure 8:
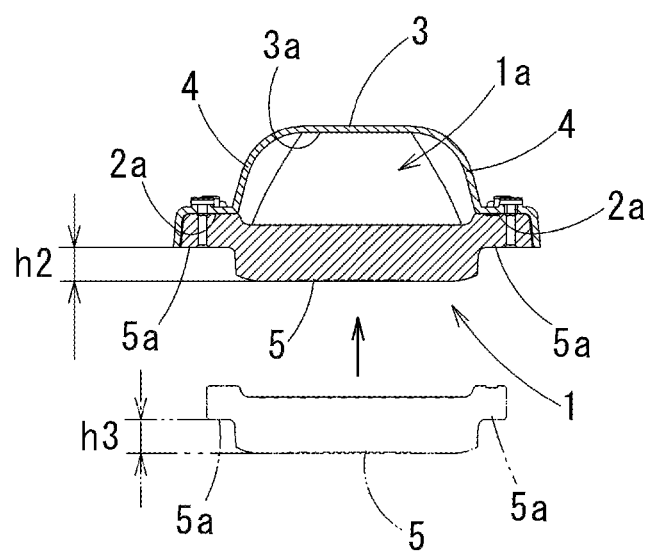
FIG. 8 is a transverse sectional view taken along the line D-D in FIG. 6, in which the handle prior to mounting to the flange portion is indicated by the two-dot chain lines.

As illustrated in FIG. 7, the handle 5 having a bar-like shape is between the both side portions, which form the long sides of the flange portion 2. The handle 5 like a bar over the bottom wall portion 3 (on the minus side in the Y direction) is connected to the both side portions in a bridging manner. The handle 5 is made of a resin material and has a substantially elliptic cross section. Both end portions 5a of the handle 5 are fixed to the flange portion 2 through screw fixation. As illustrated in FIG. 8, upper surfaces of the both end portions 5a are formed to be smaller in height than a middle portion of the handle 5, and recessed portions 2a are formed in the flange portion 2. The both end portions of the handle 5 are fixed in the recessed portions 2a, respectively. In this manner, the upper surfaces of the both end portions 5a of the handle 5 are formed so as to be flush with the surface of the flange portion 2.

A hand insertion space portion 1a, which is configured to allow insertion of a hand during carrying, is a space surrounded by the bottom wall portion 3 and the both side wall portions 4 under the handle 5 (on the plus side in the Y direction). Accordingly, it is desired that the recessed surface 3a of the bottom wall portion 3 forming a bottom surface of the hand insertion space portion 1a be a gently curved surface configured to allow easy insertion of a hand.

In this case, as illustrated in FIG. 7, one of both end portions (on the minus side in the Z direction) of the bottom wall portion 3, in which the both end portions are arranged on both ends in a direction (Z direction) orthogonal to the longitudinal direction of the handle 5, is formed so as to be recessed from and continuous with an inner peripheral edge of the flange portion 2. Meanwhile, another of the both end portions (on the plus side in the Z direction) of the bottom wall portion 3 includes a protruding portion 6 protruding from the surface of the flange portion 2. In this embodiment, as illustrated in, for example, FIG. 1, the handle component 1 is provided on a slightly upper side (plus side in the Z direction) with respect to a middle position of the side plate 15 of the box-like body 17 in the up-and-down direction (Z direction). The protruding portion 6 is arranged at an upper end portion of the handle component 1. The protruding portion 6 includes a projecting curved surface 6a, a peak portion 6b, and a perpendicular surface 6c. The projecting curved surface 6a is gently continuous with the recessed surface 3a of the bottom wall portion 3. The perpendicular surface 6c extends from the peak portion 6b of the protruding portion 6 to be connected to the flange portion 2 at a right angle. The protruding portion 6 has such a shape that the projecting curved surface 6a and the perpendicular surface 6c are smoothly continuous with each other by an arc surface of the peak portion 6b.

A height h1 of the protruding portion 6 from the surface of the flange portion 2 to the peak portion 6b is set to be equal to or smaller than a thickness "t" of the side plate 15 so that the protruding portion 6 can cover an end face of the opening portion 15a of the side plate 15. With the protruding portion 6, when the handle component 1 is mounted to the opening portion 15a, the end face of the opening portion 15a can be covered with the protruding portion 6.

Further, a distance L1 from the handle 5 to the protruding portion 6 (the peak portion 6b of the protruding portion 6) is set to be larger than a distance L2 from the handle 5 to an end portion of the bottom wall portion 3 on the opposite side of the protruding portion 6.

Further, a height h2 from the surface of the flange portion 2 to the surface of the handle 5 (see FIG. 8) is set to be equal to or smaller than the height h1 from the surface of the flange portion 2 to the surface of the peak portion 6b of the protruding portion 6. In this case, the height h2 from the surface of the flange portion 2 to the surface of the handle 5 is equal to a height h3 from the surface of each end portion 5a of the handle 5 to the surface of the handle 5 (see portions indicated by the two-dot chain lines in FIG. 8).

Figure 4:
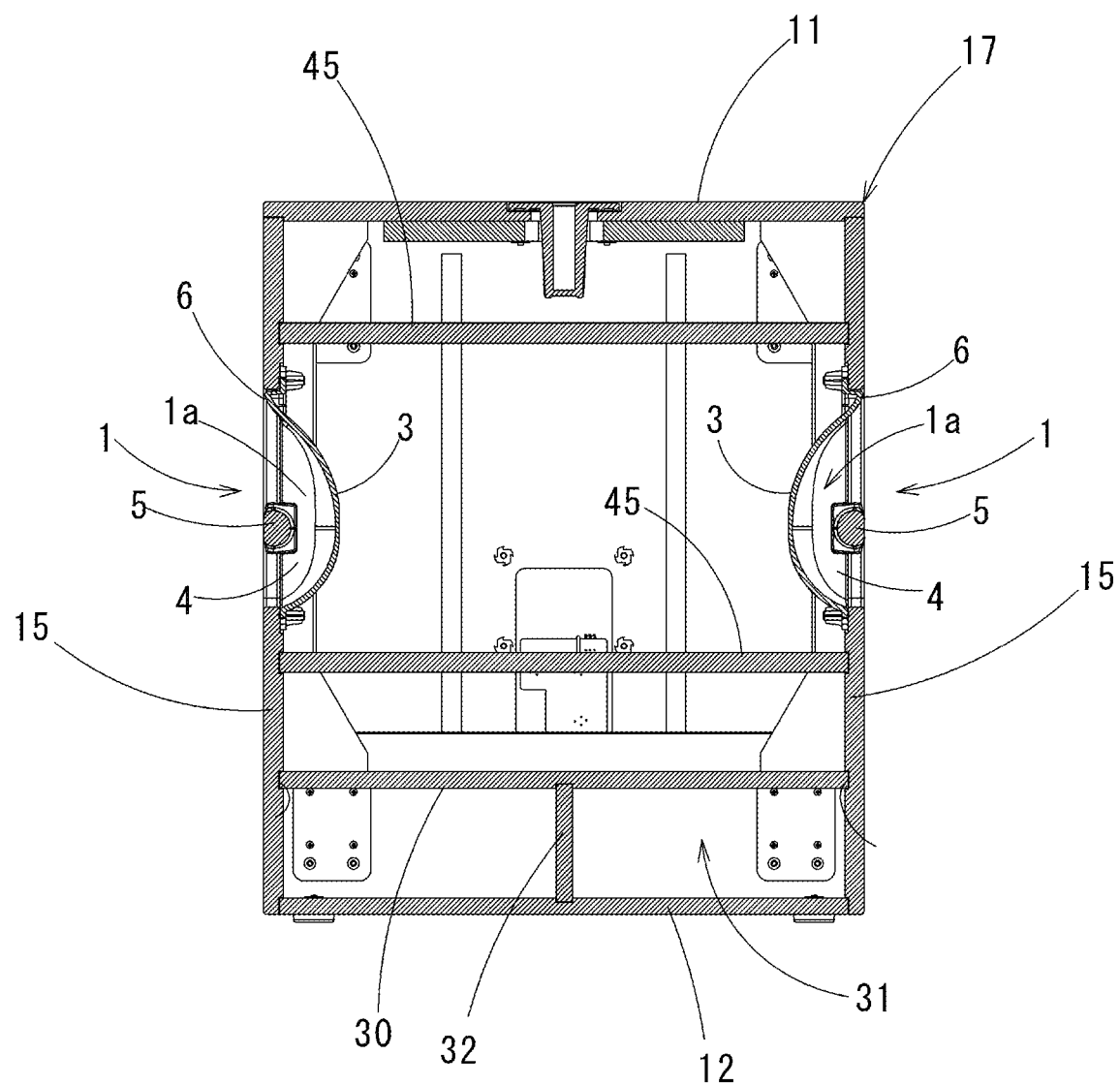
FIG. 4 is a vertical sectional view seen from a position different from that for FIG. 3, which corresponds to across section taken along the line B-B in FIG. 3.
Figure 5:
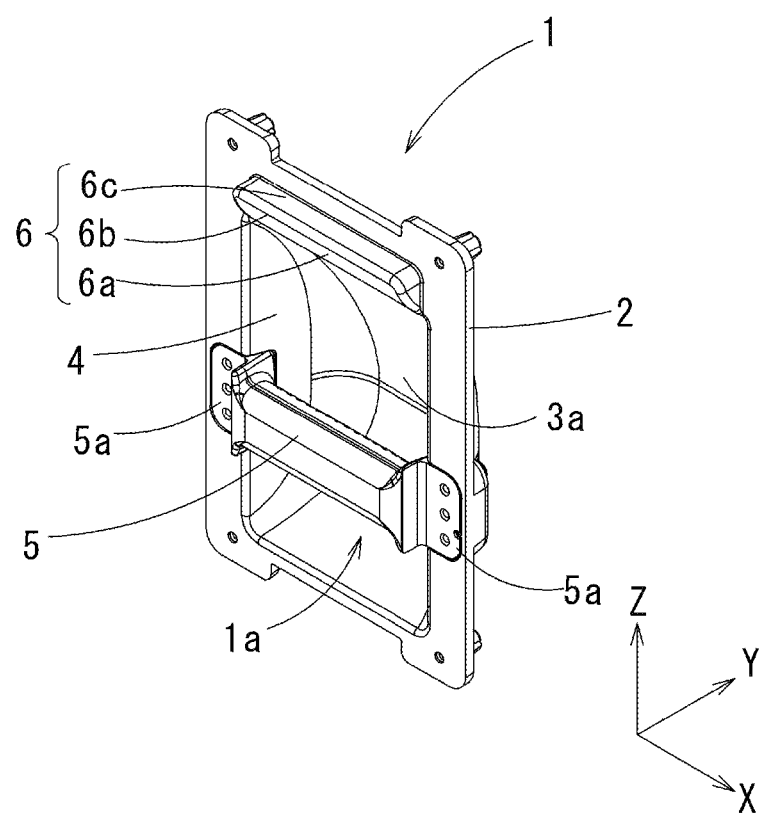
FIG. 5 is a perspective view of the handle component.
Figure 6:
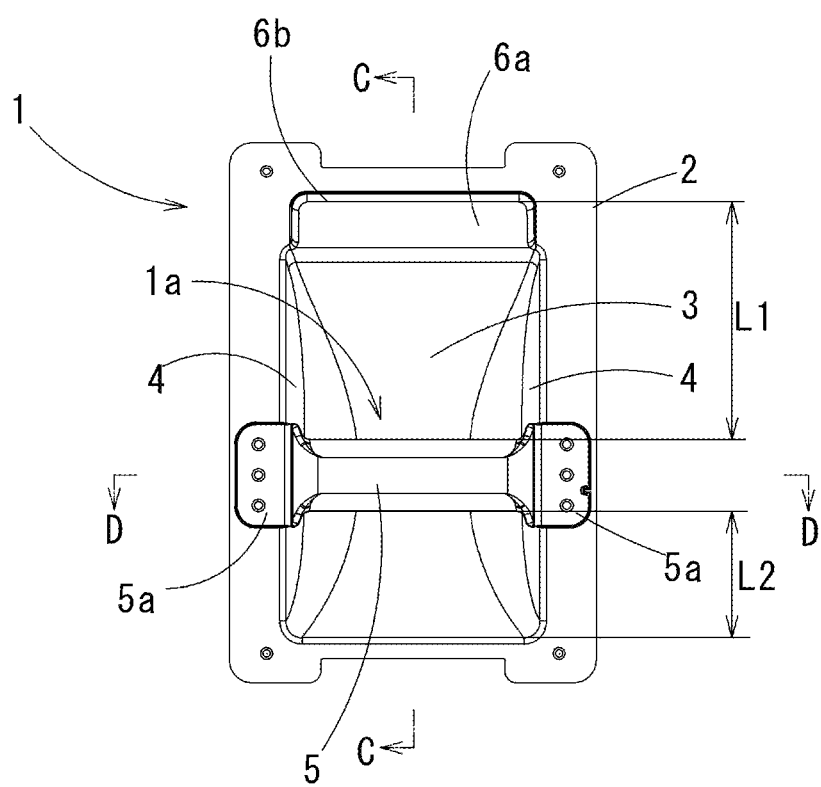
FIG. 6 is a front view of the handle component of FIG. 5.

In the speaker cabinet 10, a support plate 32 connects the partition plate 30 and the bottom plate 12 to each other. In FIG. 3 and FIG. 4, reinforcing plates 45 are arranged above and below the handle components 1 so as to connect the both side plates 15 to each other inside the speaker cabinet 10.

In the speaker device 100 including the handle components 1 configured as described above, when the speaker device 100 is lifted up by two persons during, for example, carrying, one hand is inserted into the hand insertion space portion 1a of the handle component 1 provided on each side plate 15 while the back of the hand faces the recessed surface 3a of the bottom wall portion 3, and then the handle 5 is grasped with the hand to lift up the speaker device 100. At this time, the end face of the opening portion 15a of the sideplate 15 arranged above (on the plus side in the Z direction of) the handle 5 is covered with the protruding portion 6, and hence the back of the hand or a wrist is not brought into contact with the end face of the opening portion 15a.

In addition, the distance L1 from the handle 5 to the protruding portion 6 is set to be larger than the distance L2 on the opposite side, and thus the space above (on the plus side in the Z direction of) the handle 5 becomes larger than the space on the opposite side. With this configuration, a hand is easily inserted into the hand insertion space portion 1a from above the handle 5, and the back of the hand or the wrist is less liable to hit against the protruding portion 6.

Further, the protruding portion 6 includes the projecting curved surface 6a continuous with the recessed surface 3a of the bottom wall portion 3, and thus a hand can be inserted while being guided by a region from the projecting curved surface 6a to the recessed surface 3a so that the handle 5 is grasped with the hand. Further, even when a hand comes into contact with the projecting curved surface 6a during, for example, carrying, the projecting curved surface 6a is not an angular portion unlike the peripheral edge of the opening portion 15a of the side plate 15. Thus, a pain is less liable to be felt.

Therefore, the handle component 1 can facilitate grasping of the handle 5 and carrying.

Further, the flange portion 2 of the handle component 1 is mounted to the inner surface of the side plate 15. As a result, a portion exposed to the outer side of the side plate 15 is reduced, and the handle component 1 becomes less conspicuous as a whole of the speaker cabinet 10. Accordingly, design quality of the entire speaker device 100 is improved, and luxuriousness of the speaker cabinet 10, which makes use of woody material, is not impaired.

The present invention is not limited to the above-mentioned embodiment, and various modifications can be made thereto without departing from the gist of the present invention.

In the speaker device 100 according to the embodiment, the protruding portion 6 is formed so as to cover the end face of one side of the opening portion 15a having a rectangular shape. However, when the opening portion 15a has a rectangular shape, the protruding portion may be formed along an entire inner periphery of the flange portion 2 so as to cover four sides of the opening portion 15a, or the protruding portion may be formed at three sides of the opening portion 15a excluding an end portion thereof below (on the minus side in the Z direction of) the handle 5. The opening portion may have a circular shape or a polygonal shape as well as a rectangular shape in front view. Also in this case, the protruding portion may be formed at an end portion on a side on which the back of the hand or the wrist is arranged when the hand is inserted into the hand insertion space portion.

Further, in the embodiment, description is made of the example in which the handle components 1 are mounted to the speaker cabinet 10 of the speaker device 100. However, the handle component 1 can be mounted to, in addition to the speaker cabinet 10, an opening portion formed in a side plate of each of various electronic devices from an inner side of the opening portion.

The invention claimed is:

1. A handle component to be mounted to an opening portion formed in a side plate of a cabinet, comprising:
   a flange portion configured to be brought into contact with a peripheral edge portion of the opening portion on an inner surface of the side plate;
   a bottom wall portion including a recessed surface that is open outward so as to form a hand insertion space portion on an inner side of the flange portion;
   a handle, which has a bar-like shape, and via which both side portions of the bottom wall portion are connected in a bridging manner; and
   a protruding portion, which is formed on at least one of both end portions of the bottom wall portion arranged at both ends in a direction orthogonal to a longitudinal direction of the handle, and is configured to cover an end face of the opening portion of the side plate,
   wherein the protruding portion includes a surface projecting outward to be connected with the recessed surface of the bottom wall portion.

2. The handle component according to claim 1, wherein a distance from the handle to the protruding portion is larger than a distance from the handle to an end portion of the bottom wall portion on an opposite side of the protruding portion.

3. The handle component according to claim 1, wherein a height from a surface of the flange portion to a surface of the handle is equal to or smaller than a height from the surface of the flange portion to a surface of a peak portion of the protruding portion.

4. A portable electronic comprising:
   a cabinet including a side plate with an opening; and
   an electronic device mounted in the opening portion of the side plate of the cabinet; and
   a handle component comprising:
      a flange portion brought into contact with a peripheral edge portion of the opening portion on an inner surface of the side plate;
      a bottom wall portion including a recessed surface that is open outward so as to form a hand insertion space portion on an inner side of the flange portion;
      a handle, which has a bar-like shape, and via which both side portions of the bottom wall portion are connected in a bridging manner; and
      a protruding portion, which is formed on at least one of both end portions of the bottom wall portion arranged at both ends in a direction orthogonal to a longitudinal direction of the handle, and covering an end face of the opening portion of the side plate,
      wherein the protruding portion includes a surface projecting outward to be connected with the recessed surface of the bottom wall portion.

5. The portable electronic device according to claim 4, wherein the height from the surface of the flange portion to the surface of the handle is equal to or smaller than a thickness of the side plate.

6. A speaker device comprising:
   a cabinet including a side plate with an opening; and
   a speaker mounted in the opening portion of the side plate of the cabinet; and
   a handle component comprising:
      a flange portion brought into contact with a peripheral edge portion of the opening portion on an inner surface of the side plate;
      a bottom wall portion including a recessed surface that is open outward so as to form a hand insertion space portion on an inner side of the flange portion;
      a handle, which has a bar-like shape, and via which both side portions of the bottom wall portion are connected in a bridging manner; and
      a protruding portion, which is formed on at least one of both end portions of the bottom wall portion arranged at both ends in a direction orthogonal to a longitudinal direction of the handle, and covering an end face of the opening portion of the side plate,
      wherein the protruding portion includes a surface projecting outward to be connected with the recessed surface of the bottom wall portion.

* * * * *